United States Patent
Su et al.

(10) Patent No.: US 9,287,077 B2
(45) Date of Patent: Mar. 15, 2016

(54) MANUFACTURING METHOD OF A FLEXIBLE DISPLAY

(71) Applicant: SHENZHEN CHINA STAR OPTOELECTRONICS TECHNOLOGY CO., LTD, Shenzhen, Guangdong (CN)

(72) Inventors: Chang-I Su, Guangdong (CN); Yangling Cheng, Guangdong (CN)

(73) Assignee: Shenzhen China Star Optoelectronics Technology Co., LTD (CN)

( * ) Notice: Subject to any disclaimer, the term of this patent is extended or adjusted under 35 U.S.C. 154(b) by 3 days.

(21) Appl. No.: 14/382,729

(22) PCT Filed: May 19, 2014

(86) PCT No.: PCT/CN2014/077752
§ 371 (c)(1),
(2) Date: Sep. 3, 2014

(87) PCT Pub. No.: WO2015/172396
PCT Pub. Date: Nov. 19, 2015

(65) Prior Publication Data
US 2015/0332885 A1 Nov. 19, 2015

(30) Foreign Application Priority Data
May 15, 2014 (CN) .......................... 2014 1 0204555

(51) Int. Cl.
*H01J 9/00* (2006.01)
*H01J 9/20* (2006.01)

(52) U.S. Cl.
CPC ........................................ *H01J 9/20* (2013.01)

(58) Field of Classification Search
CPC ......................................................... H01J 9/20
See application file for complete search history.

(56) References Cited

U.S. PATENT DOCUMENTS

| 2010/0291391 | A1* | 11/2010 | Okabe | H01L 21/6835 428/411.1 |
| 2011/0204361 | A1* | 8/2011 | Nishiki | H01L 21/268 257/52 |
| 2014/0312328 | A1* | 10/2014 | Yoon | H01L 27/1218 257/40 |

* cited by examiner

*Primary Examiner* — Donald Raleigh
(74) *Attorney, Agent, or Firm* — Emerson Thomson Bennett; Roger D. Emerson

(57) ABSTRACT

A manufacturing method of a flexible display is provided, which comprises steps of forming an silicon layer on a rigid substrate, forming a frame-type silicon layer from the silicon layer, attaching a flexible substrate onto the surface of the rigid substrate on which the frame-type amorphous silicon layer is formed, forming a display film on the flexible substrate, and dehydrogenating the frame-type silicon layer after the formation of the display film is complete, so that the flexible substrate is separated from the frame-type silicon layer for obtaining the flexible display. The manufacturing method of the flexible display prevents the problem of low yield rate caused by the damage to the plastic substrate in the separation process.

20 Claims, 3 Drawing Sheets

MANUFACTURING METHOD OF A FLEXIBLE DISPLAY

FIELD OF THE INVENTION

The present invention relates to the display field, in particular a manufacturing method of a flexible display.

BACKGROUND OF THE INVENTION

Currently, flexible displays are the trend of the next generation of displays. The advantages thereof are flexibility, lightweight and easy to carry, and can be used in the wearable device.

The existing flexible display manufacture process is attaching a plastic substrate onto a glass substrate, waiting until after the producing process of the LCD (Liquid Crystal Display), EPD (Electro-Phoretic Display) or OLED (Organic Light-Emitting Diode), etc, and then removing the plastic substrate from the glass substrate.

However, there is a flaw in the process of removing the plastic substrate, since the bonding of the plastic substrate to the glass substrate is too high, tools can not be easily inserted into the middle of the glass substrate and the plastic substrate. Therefore, the difficulty in the separation of the plastic substrate and the glass substrate is prone to cause damage to the plastic film and lower the yield rate.

SUMMARY OF THE INVENTION

A primary object of the present invention is to provide a manufacturing method of a flexible display for solving the problems in the prior art, in which when removing the plastic substrate, the bonding of the plastic substrate to the glass substrate is too high, and tools can not be easily inserted into the middle of the glass substrate and the plastic substrate, so that the difficulty in the separation of the plastic substrate and the glass substrate is prone to cause damage to the plastic film and low yield rate.

To achieve the above object, a manufacturing method of a flexible display, comprising steps of: forming an amorphous silicon layer on a rigid substrate; forming a frame-type amorphous silicon layer from the amorphous silicon layer through an exposure process and an etching process; attaching a flexible substrate onto the surface of the rigid substrate on which the frame-type amorphous silicon layer is formed; forming a multilayered display film on the flexible substrate; and dehydrogenating the frame-type amorphous silicon layer after the formation of the display film is complete, so that the flexible substrate is separated from the frame-type amorphous silicon layer for obtaining the flexible display.

The other object of the present invention is to provide a manufacturing method of a flexible display, comprising steps of: forming a silicon layer on a rigid substrate; forming a frame-type silicon layer from the silicon layer through an exposure process and an etch process; attaching a flexible substrate onto the surface of the rigid substrate on which the frame-type silicon layer is formed; forming a display film on the flexible substrate; and dehydrogenating the frame-type silicon layer after the formation of the display film is complete, so that the flexible substrate is separated from the frame-type silicon layer for obtaining the flexible display.

Preferably, the rigid substrate is a glass substrate, the material of the silicon layer is amorphous silicon, and the step of forming the silicon layer on the rigid substrate comprises a step of forming the amorphous silicon layer on the glass substrate.

Preferably, the step of forming the amorphous silicon layer on the glass substrate comprises a step of forming amorphous silicon containing hydrogen by placing the cleaned glass substrate on a chemical vapor deposition platform by a layer forming method, and increasing a ratio of hydrogen gas when forming the layer, so that amorphous silicon contains hydrogen atoms in a high ratio.

Preferably, the step of forming the frame-type silicon layer from the silicon layer through the exposure process and the etching process comprises steps of: coating a photoresist on the surface of the amorphous silicon layer, exposing the photoresist by using a photomask, developing the photoresist, and etching the amorphous silicon layer to form frame-type amorphous silicon after developing.

Preferably, the flexible substrate is a plastic substrate, and the step of attaching the flexible substrate onto the surface of the rigid substrate on which the frame-type silicon layer is formed comprises a step of attaching the plastic substrate onto the surface of the glass substrate on which the frame-type amorphous silicon layer is formed.

Preferably, the step of attaching the plastic substrate onto the surface of the glass substrate on which the frame-type amorphous silicon layer is formed comprises a step of attaching the plastic substrate onto the surface of the glass substrate on which the frame-type amorphous silicon layer is formed by a coating method.

Preferably, the step of attaching the plastic substrate onto the surface of the glass substrate on which the frame-type amorphous silicon layer is formed comprises a step of attaching the plastic substrate onto the surface of the glass substrate on which the frame-type amorphous silicon layer is formed by a lamination method.

Preferably, the step of dehydrogenating the frame-type silicon layer after the formation of the display film is complete, so that the flexible substrate is separated from the frame-type silicon layer for obtaining the flexible display comprises a step of dehydrogenating the amorphous silicon after the formation of the display film is complete, so that the hydrogen gas generated spontaneously separates the plastic substrate from the amorphous silicon layer for obtaining the flexible display.

Preferably, the step of dehydrogenating the amorphous silicon after the formation of the display film is complete, so that the hydrogen gas generated spontaneously separates the plastic substrate from the amorphous silicon layer for obtaining the flexible display comprises a step of dehydrogenating the amorphous silicon by a laser irradiation method after the formation of the display film is complete, so that the hydrogen gas generated spontaneously separates the plastic substrate from the amorphous silicon layer for obtaining the flexible display during the dehydrogenating process.

Preferably, when a flexible liquid crystal display is being manufactured, the step of forming the display film on the flexible substrate comprises a step of forming the liquid crystal display film on the flexible substrate, when the flexible electrophoretic display is being manufactured, a step of forming the electrophoretic display film on the flexible substrate, or when the flexible organic light emitting diode display is being manufactured, a step of forming the organic light emitting diode display film on the flexible substrate.

In the present invention, before an attachment process of a plastic substrate and a glass substrate, a process is added to form frame-type amorphous silicon containing hydrogen in a high concentration, so that the frame-type silicon is located between the plastic substrate and the glass substrate for improving the process in which a difficulty in separation causes damages to the plastic substrate and the glass substrate. After a plastic substrate coating process and a display producing process are completed, a laser is used in a dehydrogenating process, and hydrogen gas can be generated by the dehydrogenation. The hydrogen gas generated can separate the peripheral edges of the plastic substrate from the glass substrate, so that a subsequent separation process of the plastic substrate and the glass substrate can be finished easily, and the problem of low yield rate caused by the damage to the plastic substrate in the separation process is prevented.

DETAILED DESCRIPTION OF THE PREFERRED EMBODIMENTS

For making the object of the present invention, technical solutions, and beneficial effects more clearly understood, the embodiments in the present invention in conjunction with the accompanying drawings will be described below in detail. It should be understood that the specific embodiments described herein are merely to illustrate the invention, and are not used to limit the present invention.

In the present embodiment of the present invention, before a plastic substrate and a glass undergo an attachment process, a process is added to form frame-type amorphous silicon containing hydrogen in a high concentration. After a display film, such as LCD, EPD or OLED display film, is finished, a laser is used in a dehydrogenating process, and hydrogen gas can be generated by the dehydrogenation. The hydrogen gas generated can separate the peripheral edges of the plastic substrate from the glass substrate, so that the subsequent separation process of a plastic substrate and the glass substrate can be finished easily, and the problem of low yield rate caused by the damage to the plastic substrate in the separation process is prevented.

Figure 1:
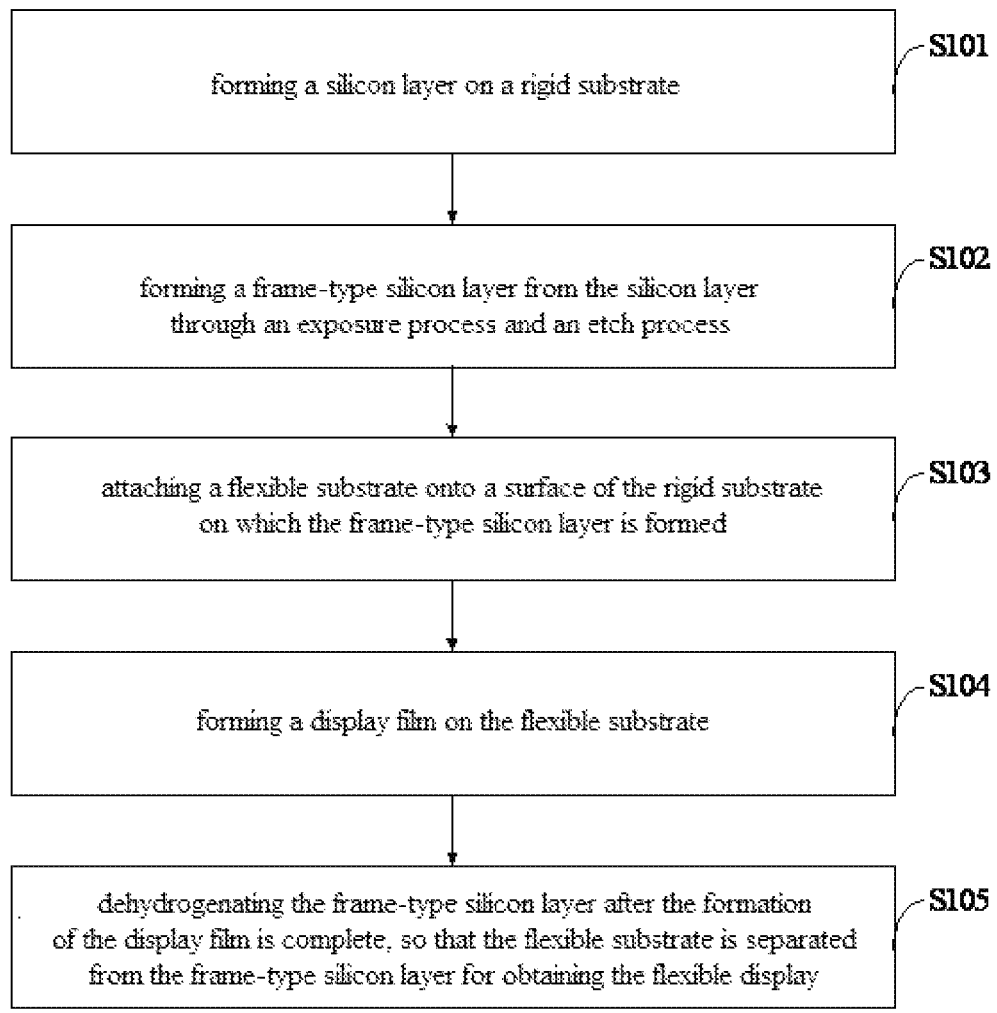
FIG. 1 is a schematic flow chart of a manufacturing method of a flexible display provided by an embodiment of the present invention.

FIG. 1 is a schematic flow chart of a manufacturing method of a flexible display provided by an embodiment of the present invention, comprising the following steps of:

In step S101, a silicon layer is formed on a rigid substrate.

In the embodiment of the present invention, the rigid substrate, for example, is a quartz substrate or a glass substrate, but is not limited thereto. Preferably, a glass substrate is used as the rigid substrate in the embodiment of the present invention. The material of the silicon layer is amorphous silicon, monocrystalline silicon, or polycrystalline silicon, for example. Preferably, amorphous silicon is used as the material of the silicon layer in the embodiment of the present invention. Thus, preferably, the amorphous silicon layer 10 is formed on the glass substrate 20 in the embodiment of the invention.

In the embodiment of the present invention, first, amorphous silicon containing hydrogen is formed by placing the cleaned glass substrate on a chemical vapor deposition (CVD) platform by a layer forming method, and increasing a ratio of hydrogen gas when forming the layer, so that amorphous silicon contains hydrogen in a high ratio.

Preferably, for ensuring the effective laser irradiation and the effective hydrogen generation, the thickness of the amorphous silicon will generally be more than 1000 A. In the embodiment of the present invention, the silicon layer is implemented as amorphous silicon with a thickness of about 1000 A.

In step S102, a frame-type silicon layer is formed from the silicon layer through the exposure process and the etching process.

Preferably, the frame-type amorphous silicon is formed from amorphous silicon through the exposure process and the etching process in the embodiment of the present invention.

Figure 2:
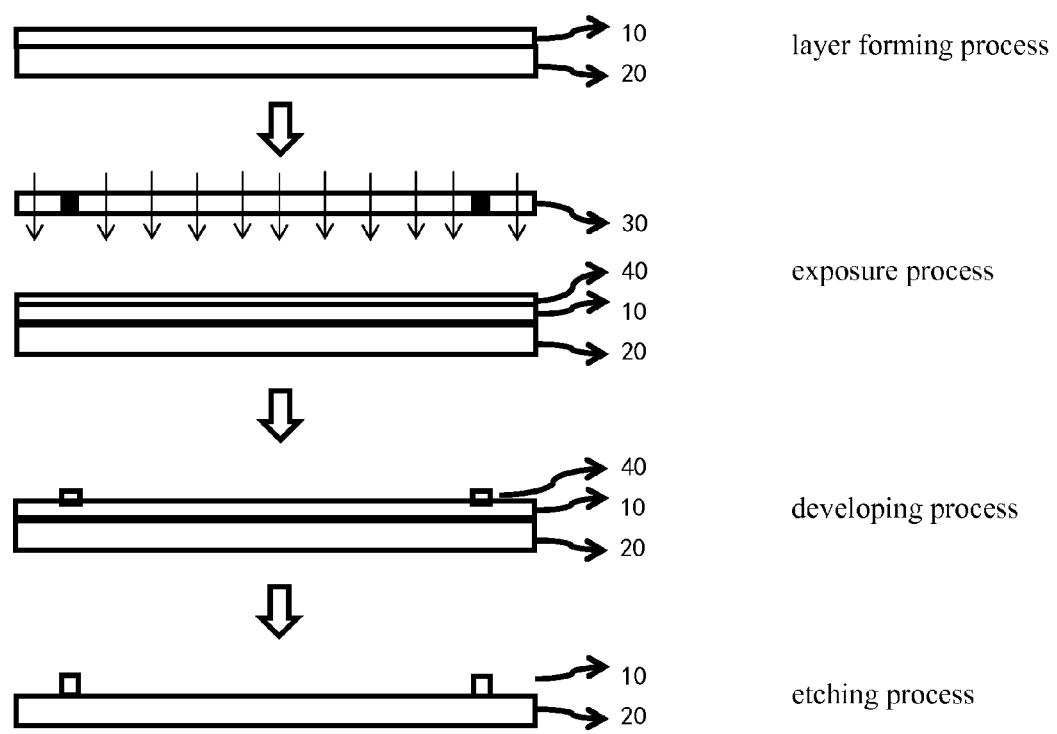
FIG. 2 is a schematic flow chart of forming frame-type amorphous silicon provided by an embodiment of the present invention.

Referring to FIG. 2, a photoresist 40 is coated on the surface of the amorphous silicon layer 10, then the photoresist is exposed by using a photomask 30, the photoresist is developed subsequently, and the amorphous silicon layer is etched to form the frame-type amorphous silicon after the photoresist is developed.

In the embodiment of the present invention, the use of the frame-type amorphous silicon can reduce the laser number and the irradiation time, reduce the laser costs, increase the yield rate, and prevent the plastic substrate from possible displacement after the comprehensive dehydrogenating separation of the amorphous silicon, which results in difficulties in subsequent processes and continuous manufacture.

In step S103, a flexible substrate is attached onto the surface of the rigid substrate on which the frame-type amorphous silicon layer is formed.

In the embodiment of the present invention, the flexible substrate is, for example, a glass film substrate, a stainless steel film substrate, or a plastic substrate, but is not limited thereto. Preferably, a plastic substrate is used as the flexible substrate in the embodiment of the present invention. Thus, preferably, in the embodiment of the present invention, the plastic substrate 50 is attached onto the surface of the glass substrate on which the frame-type amorphous silicon is formed.

Figure 3:
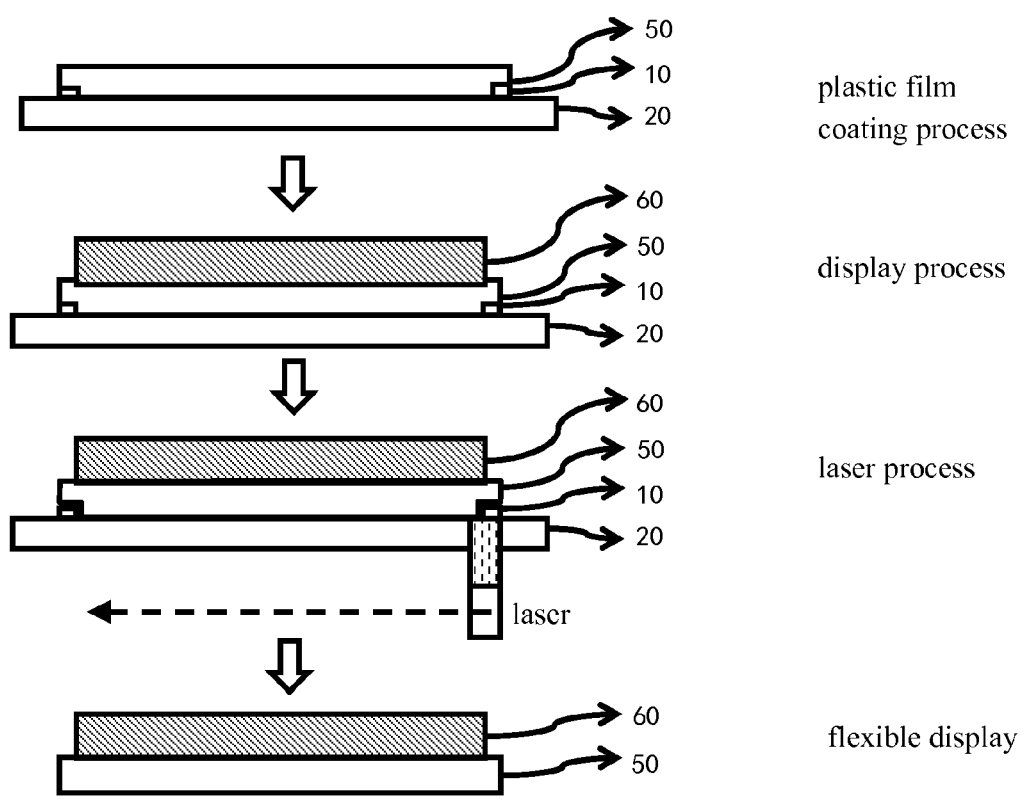
FIG. 3 is a schematic flow chart of obtaining a flexible display provided by an embodiment of the present invention.

Referring to FIG. 3, in the embodiment of the present invention, the plastic substrate 50 is attached onto the surface of the glass substrate on which the frame-type amorphous silicon is formed by a coating method or a lamination method, wherein the plastic substrate is a plastic film, and the materials in common use are PI (polyimide, orientation film), PEN (polyethylene naphthalate), PET (polyethylene terephthalate), and the like.

In step S104, a display film is formed on the flexible substrate.

Preferably, in the embodiment of the present invention, the display film 60 is formed on the plastic substrate 50.

In the embodiment of the present invention, specifically, the multilayered display film is formed on the plastic substrate.

In an embodiment of the present invention, when a flexible liquid crystal display (LCD) is being manufactured, in step S104, a liquid crystal display (LCD) film is formed on the flexible substrate. Preferably, the liquid crystal display (LCD) film is formed on the plastic substrate.

In another embodiment of the present invention, when a flexible electrophoretic display (EPD) is being manufactured, in step S104, an electrophoretic display (EPD) film is formed on the flexible substrate. Preferably, the electrophoretic display (EPD) film is formed on the plastic substrate.

In a further embodiment of the present invention, when a flexible organic light emitting diode display (OLED) is being manufactured, in step S104 an organic light emitting diode display (OLED) film is formed on the flexible substrate. Preferably, the organic light emitting diode display (OLED) film is formed on the plastic substrate.

Specifically, this comprises:

First, an organic light emitting diode display film is formed on the plastic substrate, and the organic light emitting diode display film is encapsulated, so as to form the encapsulation layer, wherein, for example, the organic light emitting diode display includes a control circuit of a thin film transistor, a conductive electrode, an organic material functional layer, and a metal electrode, etc. For example, the encapsulation method of the organic light emitting diode display film includes a metal encapsulation method, a glass encapsulation method, a plastic encapsulation method, or a thin film encapsulation method, but is not limited thereto. Since the components of the organic light emitting diode display film are seriously sensitive to corrosion of water vapor and oxygen, in the manufacture process, water vapor and oxygen should be avoided, or the component should be manufactured in a vacuum environment. Manufacturing organic light-emitting diode display films and encapsulating organic light emitting diode display films to form the encapsulation layer are well known to a person skilled in the art, and are not described redundantly.

In step S105, the frame-type amorphous silicon layer is dehydrogenated after the formation of the display film is complete, so that the flexible substrate is separated from the frame-type silicon layer for obtaining the flexible display.

Preferably, in the embodiment of the present invention, the amorphous silicon is dehydrogenated after the formation of the display film is complete, so that the hydrogen gas generated spontaneously separates the plastic substrate from the amorphous silicon layer for obtaining the flexible display.

In the embodiment of the present invention, step S105 includes dehydrogenating the amorphous silicon by a laser irradiation method after the formation of the display film is complete, so that the hydrogen gas generated spontaneously separates the plastic substrate from the amorphous silicon layer for obtaining the flexible display during the dehydrogenating process. Preferably, the laser can be implemented as an excimer laser.

However, it is understood that the frame-type amorphous silicon is sandwiched between the plastic substrate and the glass substrate, so that only the four peripheral edges of the plastic substrate and the glass substrate sandwich the amorphous silicon, and there is no amorphous silicon sandwiched in the places other than the edges. Thus, a laser irradiation method is adopted to dehydrogenate the amorphous silicon. The hydrogen gas generated spontaneously separates the amorphous silicon from the peripheral edges of the plastic substrate during the dehydrogenating process. Therefore, the required number of lasers and the irradiation time can be reduced, thereby the laser cost is reduced, and the yield rate is increased. In addition, after the comprehensive dehydrogenating separation of the amorphous silicon, possible displacement of the plastic substrate resulting in difficulties in subsequent processes and continuous production can be prevented.

For example, based on the size of G8.5 glass, it is calculated that the irradiation time is required to be over 240 seconds by the conventional laser irradiation method for dehydrogenating the amorphous silicon, while the frame-type design adopted in the embodiment of the present invention can reduce it to fewer than 50 seconds.

From the foregoing, before the attachment process of a plastic substrate and the glass substrate, a process is added to form frame-type amorphous silicon containing hydrogen in a high concentration, so that the frame-type silicon is located between the plastic substrate and the glass substrate for improving the process in which a difficulty in separation causes damage to the plastic substrate and the glass substrate. After a plastic substrate coating process and a display producing process are completed, a laser is used in a dehydrogenating process, and hydrogen gas can be generated by the dehydrogenation. The hydrogen gas generated can separate the peripheral edges of the plastic substrate from the glass substrate, so that the subsequent separation process of a plastic substrate and the glass substrate can be finished easily, and the problem of low yield rate caused by the damage to the plastic substrate in the separation process is prevented.

When the technical solutions provided by the embodiment of the present invention is compared with the prior art in which the amorphous silicon layer is not used, although adding the photomask process results in cost increase by approximately 10 to 15%, the yield rate is enhanced drastically. According to the experimental analysis, the yield of the separation process without using the amorphous silicon is about 5%, while the yield of the technique provided by the embodiment of the present invention is raised to over 90%.

The following, in conjunction with FIG. 2 and FIG. 3, describes the embodied processes of the manufacturing method of the flexible display provided by the embodiment of the present invention in detail.

1. First, the amorphous silicon containing hydrogen is formed by placing the cleaned glass substrate on a chemical vapor deposition (CVD) platform by a layer forming method, and increasing a ratio of hydrogen gas when forming the layer, so that amorphous silicon contains hydrogen atoms in a high ratio.
2. The photoresist is coated onto the surface of the amorphous silicon.
3. Afterward, the photomask is used for exposing the photoresist.
4. Subsequently, the photoresist is developed.
5. After the development, the amorphous silicon is etched to form a frame-type amorphous silicon.
6. The plastic substrate is attached onto the surface of the glass substrate on which the frame-type amorphous silicon layer is formed by a coating method of a lamination method.
7. The display film is formed on the plastic substrate.
8. The amorphous silicon is dehydrogenated by the laser irradiation method after the formation of the display film is complete, so that the hydrogen gas generated spontaneously separates the plastic substrate from the amorphous silicon layer for obtaining the flexible display during the dehydrogenating process.

In summary, before a attachment process of a plastic substrate and a glass substrate, a process is added to form frame-type amorphous silicon containing hydrogen in a high concentration, so that the frame-type silicon is located between the plastic substrate and the glass substrate for improving the process in which a difficulty in separation causes damage to the plastic substrate and the glass substrate. After a plastic substrate-coating process and a display producing process are completed, a laser is used in a dehydrogenating process, and hydrogen gas can be generated by the dehydrogenation. The hydrogen gas generated can separate the peripheral edges of the plastic substrate from the glass substrate, so that a subsequent separation process of the plastic substrate and the glass substrate can be finished easily, and the problem caused by the damages to the plastic substrate in the separation process is prevented.

The foregoing description is only a preferred embodiment of the invention, and is not used to limit the invention. Any modifications, equivalent replacements, improvements, etc. which are made within the spirit and principles of the present invention should be included within the protection scope of the present invention.

What is claimed:

1. A manufacturing method of a flexible display, comprising steps of:
   forming an amorphous silicon layer on a rigid substrate;
   forming a frame-type amorphous silicon layer from the amorphous silicon layer through an exposure process and an etch process;
   attaching a flexible substrate onto the surface of the rigid substrate on which the frame-type amorphous silicon layer is formed;
   forming a multilayered display film on the flexible substrate; and
   dehydrogenating the frame-type amorphous silicon layer after the formation of the display film is complete, so that the flexible substrate is separated from the frame-type amorphous silicon layer for obtaining the flexible display.

2. The manufacturing method of the flexible display as claimed in claim 1, wherein the rigid substrate comprises a glass substrate, and the step of forming the amorphous silicon layer on the rigid substrate comprises a step of forming the amorphous silicon layer on the glass substrate.

3. The manufacturing method of the flexible display as claimed in claim 2, wherein the step of forming the amorphous silicon layer on the glass substrate comprises a step of forming amorphous silicon containing hydrogen by placing the cleaned glass substrate on a chemical vapor deposition platform by a layer forming method, and increasing a ratio of hydrogen gas when forming the layer, so that amorphous silicon contains hydrogen atoms in a high ratio.

4. The manufacturing method of the flexible display as claimed in claim 2, wherein the step of forming the frame-type amorphous silicon layer from the amorphous silicon layer through the exposure process and the etching process comprises steps of:
   coating a photoresist on the surface of the amorphous silicon layer;
   exposing the photoresist by using a photomask;
   developing the photoresist; and
   etching the amorphous silicon layer to form the frame-type amorphous silicon after developing.

5. The manufacturing method of the flexible display as claimed in claim 2, wherein the flexible substrate comprises a plastic substrate, and the step of attaching the flexible substrate onto the surface of the rigid substrate on which the frame-type amorphous silicon layer is formed comprises a step of attaching the plastic substrate onto the surface of the glass substrate on which the frame-type amorphous silicon layer is formed.

6. The manufacturing method of the flexible display as claimed in claim 5, wherein the step of attaching the plastic substrate onto the surface of the glass substrate on which the frame-type amorphous silicon layer is formed comprises a step of attaching the plastic substrate onto the surface of the glass substrate on which the frame-type amorphous silicon layer is formed by a coating method.

7. The manufacturing method of the flexible display as claimed in claim 5, wherein the step of attaching the plastic substrate onto the surface of the glass substrate on which the frame-type amorphous silicon layer is formed comprises a step of attaching the plastic substrate onto the surface of the glass substrate on which the frame-type amorphous silicon layer is formed by a lamination method.

8. The manufacturing method of the flexible display as claimed in claim 5, wherein the step of dehydrogenating the frame-type amorphous silicon layer after the formation of the display film is complete, so that the flexible substrate is separated from the frame-type amorphous silicon layer for obtaining the flexible display comprises a step of dehydrogenating the amorphous silicon after the formation of the display film is complete, so that the hydrogen gas generated separates the plastic substrate from the amorphous silicon layer for obtaining the flexible display.

9. The manufacturing method of the flexible display as claimed in claim 8, wherein the step of dehydrogenating the amorphous silicon after the formation of the display film is complete, so that the hydrogen gas generated spontaneously separates the plastic substrate from the amorphous silicon layer for obtaining the flexible display comprises a step of dehydrogenating the amorphous silicon by a laser irradiation method after the formation of the display film is complete, so that the hydrogen gas generated spontaneously separates the plastic substrate from the amorphous silicon layer for obtaining the flexible display during the dehydrogenating process.

10. The manufacturing method of the flexible display as claimed in claim 1, wherein when a flexible liquid crystal display is being manufactured, the step of forming the multilayered display film on the flexible substrate comprises a step of forming the liquid crystal display film on the flexible substrate.

11. A manufacturing method of a flexible display, comprising steps of:
    forming a silicon layer on a rigid substrate;
    forming a frame-type silicon layer from the silicon layer through an exposure process and an etch process;
    attaching a flexible substrate onto the surface of the rigid substrate on which the frame-type silicon layer is formed;
    forming a display film on the flexible substrate; and
    dehydrogenating the frame-type silicon layer after the formation of the display film is complete, so that the flexible substrate is separated from the frame-type silicon layer for obtaining the flexible display.

12. The manufacturing method of the flexible display as claimed in claim 11, wherein the rigid substrate comprises a glass substrate, the material of the silicon layer comprises amorphous silicon, and the step of forming the silicon layer on the rigid substrate comprises a step of forming the amorphous silicon layer on the glass substrate.

13. The manufacturing method of the flexible display as claimed in claim 12, wherein the step of forming the amorphous silicon layer on the glass substrate comprises a step of forming amorphous silicon containing hydrogen by placing the cleaned glass substrate on a chemical vapor deposition platform by a layer forming method, and increasing a ratio of hydrogen gas when forming the layer, so that amorphous silicon contains hydrogen atoms in a high ratio.

14. The manufacturing method of the flexible display as claimed in claim 12, wherein the step of forming the frame-type silicon layer from the silicon layer through the exposure process and the etch process comprises steps of:
    coating a photoresist on the surface of the amorphous silicon layer;
    exposing the photoresist by using a photomask; and
    developing the photoresist;
    etching the amorphous silicon layer to form frame-type amorphous silicon after developing.

15. The manufacturing method of the flexible display as claimed in claim 12, wherein the flexible substrate comprises a plastic substrate, and the step of attaching the flexible substrate onto the surface of the rigid substrate on which the frame-type silicon layer is formed comprises a step of attaching the plastic substrate onto the surface of the glass substrate on which the frame-type amorphous silicon layer is formed.

16. The manufacturing method of the flexible display as claimed in claim 15, wherein the step of attaching the plastic substrate onto the surface of the glass substrate on which the frame-type amorphous silicon layer is formed comprises a step of attaching the plastic substrate onto the surface of the glass substrate on which the frame-type amorphous silicon layer is formed by a coating method.

17. The manufacturing method of the flexible display as claimed in claim 15, wherein the step of attaching the plastic substrate onto the surface of the glass substrate on which the frame-type amorphous silicon layer is formed comprises a step of attaching the plastic substrate onto the surface of the glass substrate on which the frame-type amorphous silicon layer is formed by a lamination method.

18. The manufacturing method of the flexible display as claimed in claim 15, wherein the step of dehydrogenating the frame-type silicon layer after the formation of the display film is complete, so that the flexible substrate is separated from the frame-type silicon layer for obtaining the flexible display comprises a step of dehydrogenating the amorphous silicon after the formation of the display film is complete, so that the hydrogen gas generated spontaneously separates the plastic substrate from the amorphous silicon layer for obtaining the flexible display.

19. The manufacturing method of the flexible display as claimed in claim 18, wherein the step of dehydrogenating the amorphous silicon after the formation of the display film is complete, so that the hydrogen gas generated spontaneously separates the plastic substrate from the amorphous silicon layer for obtaining the flexible display comprises a step of dehydrogenating the amorphous silicon by a laser irradiation method after the formation of the display film is complete, so that the hydrogen gas generated spontaneously separates the plastic substrate from the amorphous silicon layer for obtaining the flexible display during the dehydrogenating process.

20. The manufacturing method of the flexible display as claimed in claim 11, wherein when a flexible liquid crystal display is being manufactured, the step of forming the display film on the flexible substrate comprises a step of forming the liquid crystal display film on the flexible substrate.

\* \* \* \* \*